United States Patent [19]
Knierim et al.

[11] Patent Number: 5,406,507
[45] Date of Patent: Apr. 11, 1995

[54] REDUCED INPUT CAPACITANCE ANALOG STORAGE ARRAY

[75] Inventors: Daniel G. Knierim; Steven K. Sullivan, both of Beaverton, Oreg.

[73] Assignee: Tektronix, Inc., Wilsonville, Oreg.

[21] Appl. No.: 65,011

[22] Filed: May 24, 1993

[51] Int. Cl.⁶ .............................................. H03K 17/00
[52] U.S. Cl. ...................................... 365/45; 365/102; 327/94; 327/427
[58] Field of Search ................. 377/60; 365/45, 180, 365/102; 307/352, 246, 571

[56] References Cited

U.S. PATENT DOCUMENTS 3,986,174 10/1976 Wisseman et al. ............... 365/180
4,922,452 5/1990 Larsen et al. .................... 365/45
5,210,777 5/1993 Warabu et al. ................... 377/60

Primary Examiner—John S. Heyman
Attorney, Agent, or Firm—Francis I. Gray; Boulden G. Griffith

[57] ABSTRACT

Reduction of input capacitance in an analog storage array is achieved by reducing the parasitic capacitance presented to an analog signal line. Each column of the analog storage array is coupled to the analog signal line by a separate coupling switch. The switches are activated so that no more than two columns are coupled to the analog signal line at any time, with the next column to be accessed being coupled to the analog signal line prior to access to that column, and the last column being decoupled from the analog signal line after the last cell in the column has been accessed. Further the analog signal line may provide two input ports so that alternate columns of the array are coupled to one port, and the other alternate columns are coupled to the other port so that two adjacent columns are coupled to separate ones of the two ports.

5 Claims, 2 Drawing Sheets

REDUCED INPUT CAPACITANCE ANALOG STORAGE ARRAY

BACKGROUND OF THE INVENTION

The present invention relates to analog storage arrays, and more particularly to a two-dimensional analog storage array having reduced input capacitance by disconnecting parasitic capacitances of the analog storage array from an analog signal line to provide greater speed of access.

An analog storage array is an array of switches, typically field effect transistors (FETs), and capacitors arranged so that each capacitor in turn may be connected through one or more of the switches to an analog signal line, and then disconnected to store the signal value at the time of disconnection on the selected capacitor. This type of analog storage array allows for fast and economical sampling and storing of an analog input signal for subsequent readout at a slower rate into an analog to digital converter (ADC) for digital storage. With current manufacturing technology an array of any practical size is laid out in a two-dimensional fashion. The analog signal line then becomes a multiple of "column" lines, one for each column of capacitors in the array, connected together at one end of the columns to the analog signal line to provide the same analog input signal to all capacitors. Only the particular capacitor selected by column and row stores the value of the analog input signal at that time. Such an array is disclosed in U.S. Pat. No. 4,922,452 issued May 1, 1990 to Raymond S. Larsen et al entitled "10 Gigasample/Sec Two-Stage Analog Storage Integrated Circuit for Transient Digitizing and Imaging Oscillography hereby incorporated by reference."

As shown in U.S. Pat. No. 4,922,452 each capacitor is coupled to the analog signal line by a pair of switches connected in series. The first switch in the series is a row switch, in that it turns on when that row including that cell is accessed, i.e., it turns on and off rapidly. The second switch in the series is a column switch that turns on when that column accessed, i.e., the column switch for all of the capacitors in the column are turned on and off simultaneously before and after, respectively, all of the rows have been accessed. A significant problem with analog storage arrays is the relatively large input signal capacitance which limits the speed at which the capacitors may be accessed since the capacitance has to be charged for each value stored in the array. This input capacitance has two terms: the capacitance of the capacitor(s) connected to the analog signal line at any given time, and the parasitic capacitances of the metal lines and switches. The parasitic capacitances are dominant, as only one or a few capacitors are switched to the analog signal line at a time, while all of the parasitic capacitances for the entire array of capacitors are continuously connected to the analog signal line.

What is desired is a reduced input capacitance analog storage array that minimizes the parasitic capacitances to provide higher speed sampling capabilities.

SUMMARY OF THE INVENTION

Accordingly the present invention provides a method for the reduction of input capacitance in an analog storage array by disconnecting from an analog signal line those columns of storage cells that are not active at a given time. In addition to the row and column switches that exist in each cell of the analog storage array, a switch is provided at the head of each column to selectively disconnect the analog signal line from the column. Additionally to reduce transients in the input signal from the analog signal line when each column switch switches, two input ports are used to provide the input signal to the analog storage array, with alternate columns coupled together between the analog signal line and the column switches.

The objects, advantages and other novel features of the present invention are apparent from the following detailed description when read in conjunction with the appended claims and attached drawing.

DESCRIPTION OF THE PREFERRED EMBODIMENT

Figure 1:
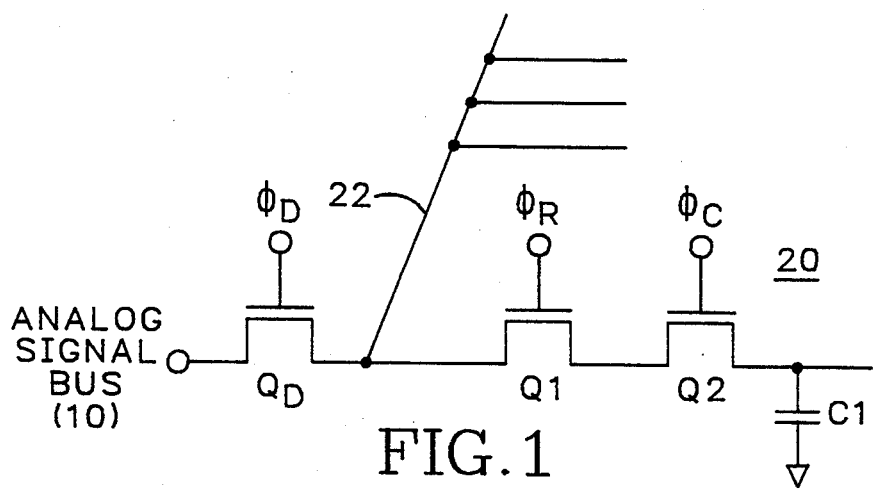
FIG. 1 is a block diagram view of a storage cell for an analog storage array according to the present invention.

Referring now to FIG. 1 the principle of operation of a basic sampling cell 20 is for an input signal on an analog sample bus 10 to be applied to the input of the cell. When the column of cells 20 is addressed, a column command $O_C$ is applied to a second field effect transistor (FET) switch Q2. The column command $O_C$ remains on for the entire time that the column of cells 20 is to be accessed. In turn each cell 20 is enabled to sample the input signal from the analog sample bus 10 by a fast row command $O_R$ applied to a first FET switch Q1. During the duration of the fast row command $O_R$ the value of the input signal charges a sampling capacitor C1, with the final charge stored being the value of the input signal at the end of the fast row command. The input capacitance at the analog signal bus 10 is (i) the selected storage capacitor C1, which is kept low, typically on the order of 0.1 picofarads, (ii) the parasitic capacitance due to the metallic runs of the integrated circuit, and (iii) the parasitic capacitance for each cell coupled to the analog signal bus. A disconnect FET switch $Q_D$ is inserted at the head of each column of cells 20 between the cells and the analog signal bus 10 so that the cells are connected to a separate column bus 22 for each column. A disconnect signal $O_D$ is applied to the disconnect FET switch $Q_D$ after all of the cells 20 in the column have been accessed. Prior to accessing the cells 20 in the column, disconnect signal $O_D$ is removed. The disconnect signal $O_D$ is removed before the column signal $O_C$ is applied so that any transients caused by the switching of the disconnect FET $Q_D$ have settled before the column of cells starts active sampling. Thus at most for a short period of time no more than two columns of cells 20 are connected to the analog signal bus 10 at one time, reducing the input capacitance by the amount of the parasitic capacitances of the disconnected columns.

Figure 2:
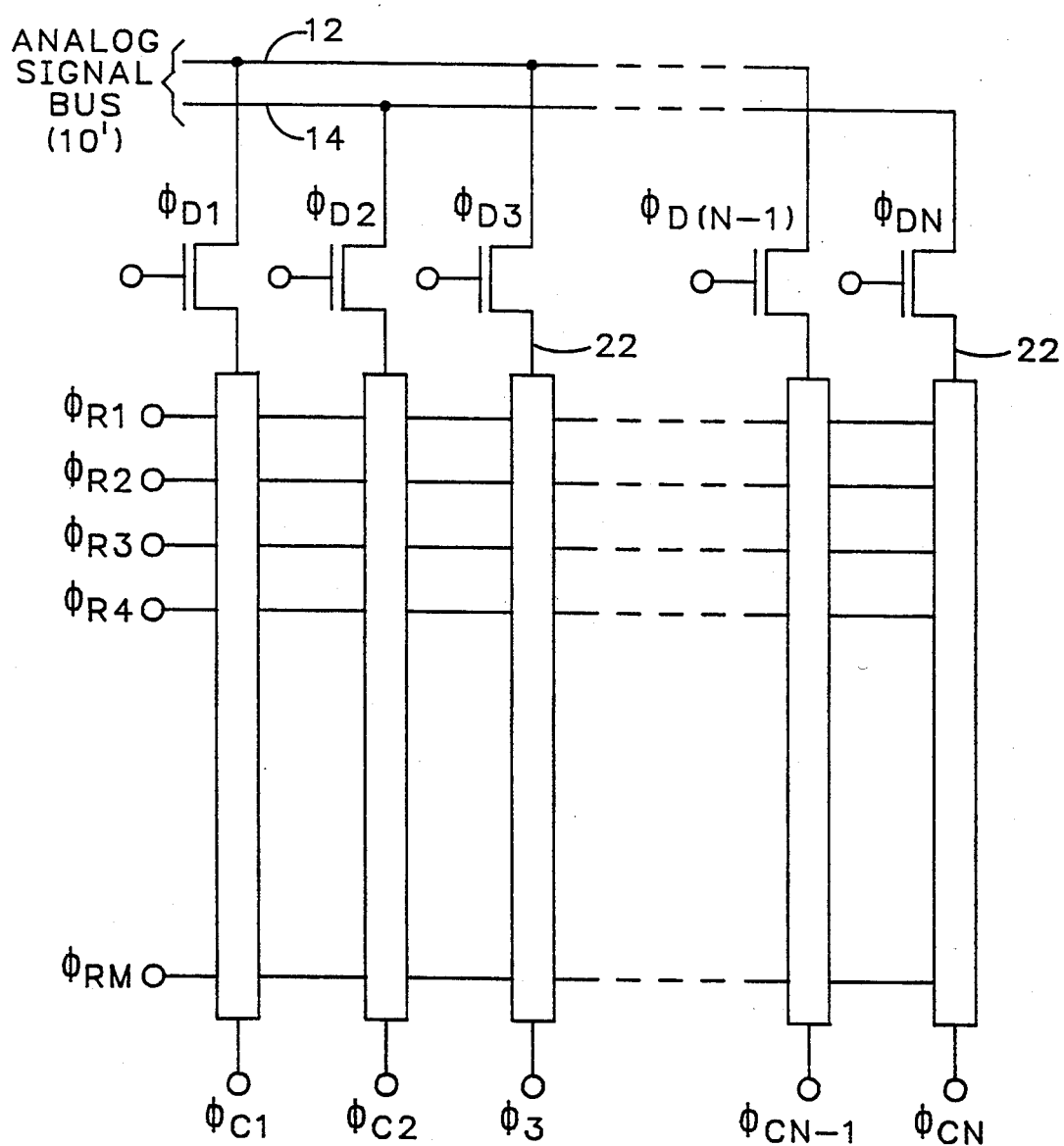
FIG. 2 is a block diagram view of an analog storage array according to the present invention.

Additional input capacitance reduction may be achieved by providing the analog sample bus 10' with two input ports 12, 14, as shown in FIG. 2. Alternate ones of the column buses 22 are coupled to the respective input ports 12, 14, a drive circuit (not shown) providing two nominally identical input signals at the input ports. Since no more than two column buses 22 are connected to the analog sample bus 10' at any time, each input port 12, 14 is connected to a single column bus at a time, further reducing the column parasitic capacitance presented to the input signal at each input port. Further, transitions of the disconnect signals for columns connected to one input port 12, 14, with accompanying transient errors, occur while cells 20 in columns connected to the other input port 14, 12 are sampling the analog input signal. Therefore the transient errors caused by the disconnect signals do not degrade the analog input signal being sampled at the active input port. More than two input ports may be used, depending upon the array configuration and sampling rates, to assure that any transient errors due to disconnect signals have settled out prior to sampling the analog input signal.

Figure 3:
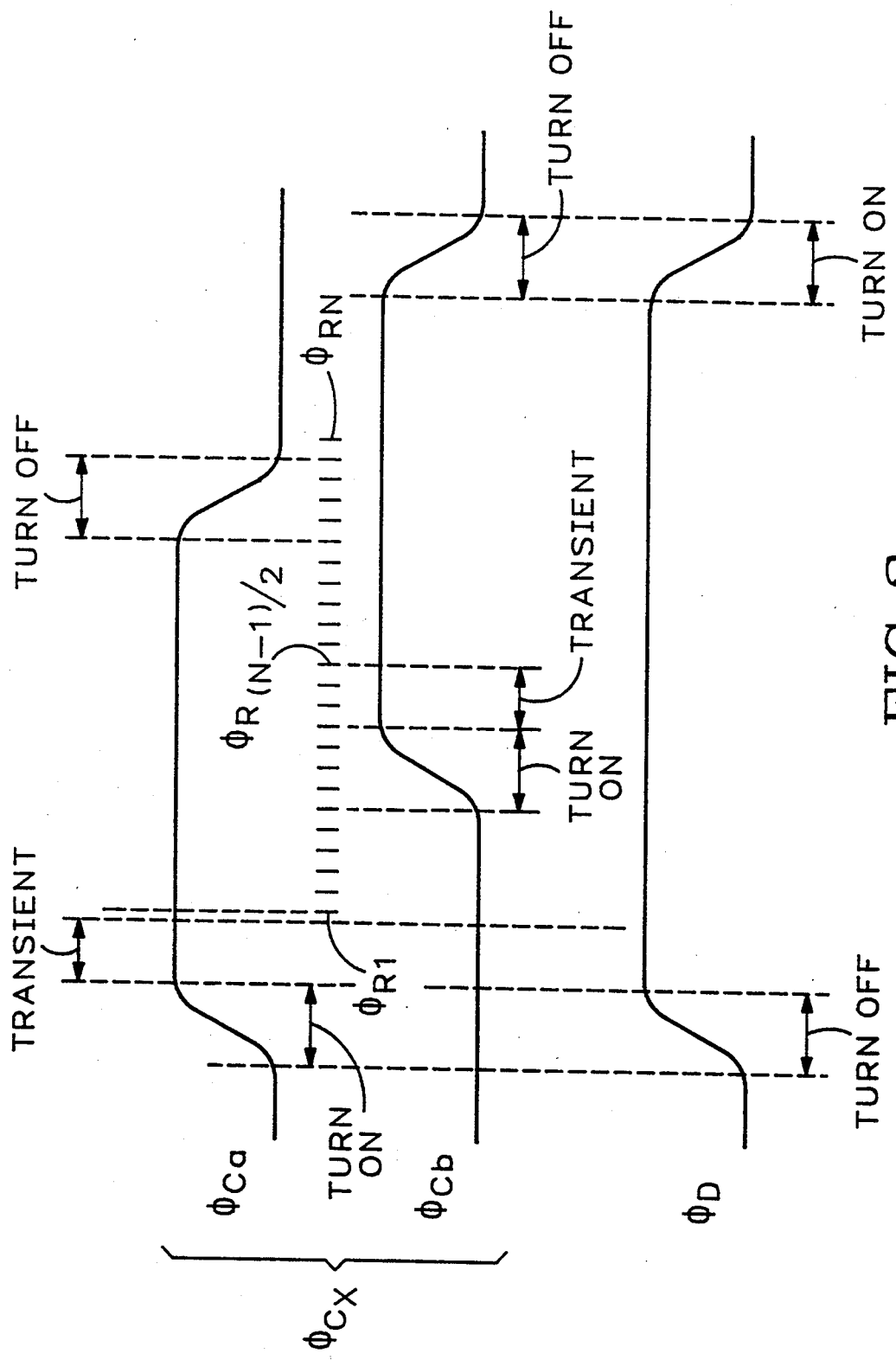
FIG. 3 is a timing diagram of a split column command for the analog storage array according to the present invention.

Preferably the column command $O_C$ is a split command, as shown in the timing diagram of FIG. 3. Since the column command is a slow speed command compared to the row command $O_R$, when the next column is accessed the column command for the prior column may still be on so that the initial row commands access both column cells rather than just one column cell. Therefore the column command for each column is split into two column commands, $O_{Ca}$, $O_{Cb}$. The first column command $O_{Ca}$ is applied to the first half of the rows of each column, and the second column command $O_{Cb}$ is applied to the second half of the rows of each column. The first column command activates after the first half of the rows of the prior column have been accessed and prior to accessing the first row of the current column, and inactivates after the first half of the rows in the current column have been accessed and prior to the end of the current column. The second column command activates after the first row in the current column is accessed and prior to the end of accessing the first half of the rows, and inactivates after the last row in the current column is accessed and prior to the end of accessing the first half of the rows in the next column. The disconnect command $O_D$ may be the logical OR of the split column commands so that it turns off prior to the current column to connect the current column to the associated driver port 12, 14 and turns on after the end of the current column to disconnect the current column from the driver port, as described above. Using slower switching signals for the column commands results in lower power usage.

Alternatively the column switch Q2 may be deleted from each cell so that only a single cell switch Q1 and a storage capacitor make up the storage cell. Due to leakage from the storage capacitor C1 the single cell switch may be controlled by the logical AND of the row and column commands $O_R$, $O_C$ so that the row command accesses only one storage cell at a time.

Thus the present invention provides a reduced input capacitance analog sampling array by adding a disconnect switch at the head of each column of sampling cells so that no more than two columns are connected to the analog signal bus to reduce the input parasitic capacitance by the amount of the disconnected columns, and additionally by providing the analog signal bus with two input ports so that only one column is connected to an input port at any time.

What is claimed is:

1. An analog storage array comprising:
    a plurality of storage cells arranged in an array of columns and rows, the storage cells of one column being coupled to a column line and each storage cell having a cell switch coupled between the column line and a storage capacitor; and
    a plurality of disconnect switches, one for each column line, for separately coupling each column line to an analog signal input line, the plurality of disconnect switches being activated so that less than all of the column lines are coupled to the analog signal input line at any time to reduce the total amount of capacitance presented to an analog signal on the analog signal input line.

2. The analog storage array as recited in claim 1 wherein the cell switch comprises:
    a column switch; and
    a row switch, the column and row switches being coupled in series between the column line and the storage capacitor.

3. The analog storage array as recited in claim 1 wherein the analog signal input line has at least two ports, with the column lines coupled in sequence to the ports so that adjacent column lines are coupled to different ones of the ports, one port connecting the analog signal to one column of cells via its disconnect switch for sampling while an adjacent column of cells is being coupled to another port via activation of its disconnect switch so that transients in the analog signal caused by activation of its disconnect switch are damped out prior to sampling the analog signal with the adjacent column of cells.

4. A method of sampling an analog signal using an array of analog storage cells configured in columns and rows, each column of storage cells being coupled to a column line and each storage cell having a cell switch coupling the column line to a storage capacitor, comprising the steps of:
    separately coupling each column line to the analog signal so that less than all of the column lines are coupled to the analog signal at any time to reduce the total amount of capacitance presented to the analog signal; and
    activating the cell switch to couple the column line to the storage capacitor.

5. A method of sampling an analog signal using an array of analog storage cells configured in columns and rows, each column of storage cells being coupled to a column line and each storage cell having a cell switch coupling the column line to a storage capacitor, comprising the steps of:
    separately coupling one of the column lines to the analog signal via a first port while another of the column lines is coupled to the analog signal via a second port, the storage cells coupled to the other column line being accessed to sample the analog input signal;
    sampling the analog input signal with the storage cells coupled to the one column line when the sampling by the storage cells of the other column line is complete; and
    decoupling the one column line from the first port when the sampling by the storage cells of the one column line is complete;
    whereby transients caused by coupling the one column line to the analog signal are damped out before the storage cells coupled to the one column line are accessed to sample the analog signal.

* * * * *